United States Patent [19]
Voss

[11] Patent Number: 4,987,087
[45] Date of Patent: Jan. 22, 1991

[54] PROCESS FOR MANUFACTURING A THYRISTOR WITH PROTON IRRADIATION

[75] Inventor: Peter Voss, Munich, Fed. Rep. of Germany

[73] Assignee: Siemens Aktiengesellschaft, Berlin and Munich, Fed. Rep. of Germany

[21] Appl. No.: 348,231

[22] Filed: May 5, 1989

[30] Foreign Application Priority Data

May 19, 1988 [DE] Fed. Rep. of Germany ....... 3817160

[51] Int. Cl.$^5$ .............................................. H01L 21/26
[52] U.S. Cl. .......................................... 437/6; 437/24; 437/228; 148/DIG. 26
[58] Field of Search ............... 437/6, 24, 228; 351/38, 351/39; 148/DIG. 26

[56] References Cited

U.S. PATENT DOCUMENTS

| | | |
|---|---|---|
| 3,990,091 | 11/1976 | Cresswell et al. ........................ 437/6 |
| 4,056,408 | 11/1977 | Bartko et al. ........................ 148/1.5 |
| 4,278,475 | 7/1981 | Bartko et al. ............................ 437/6 |
| 4,311,534 | 1/1982 | Bartko et al. ............................. 437/6 |

FOREIGN PATENT DOCUMENTS

| | | |
|---|---|---|
| 0014516 | 1/1980 | European Pat. Off. . |
| 2300754 | 7/1974 | Fed. Rep. of Germany . |
| 2346205 | 7/1981 | Fed. Rep. of Germany . |
| 3117202 | 11/1982 | Fed. Rep. of Germany . |
| 3339393 | 5/1985 | Fed. Rep. of Germany . |

Primary Examiner—Olik Chaudhuri
Assistant Examiner—Tom Thomas
Attorney, Agent, or Firm—Eugene S. Indyk; John F. Moran

[57] ABSTRACT

A process for making a thyristor device protected against breakover firing is to generate in the semiconductor body (1) of the thyristor an area (A) which has a lower breakdown voltage than the rest of the semiconductor body. This area is protected by suitable measures when the thyristor is overloaded. The invention features a process in which the area (A) of the semiconductor body (1) is irradiated locally with protons, with the proton energy being measured in such a manner that the maximum of the defect density and doping generated by the proton irradiation lies between the PN junction (15) of the first base region (9) and the second base region (10) and the half thickness of the second base region (10), and the semiconductor body (1) is subsequently heat-treated.

18 Claims, 2 Drawing Sheets

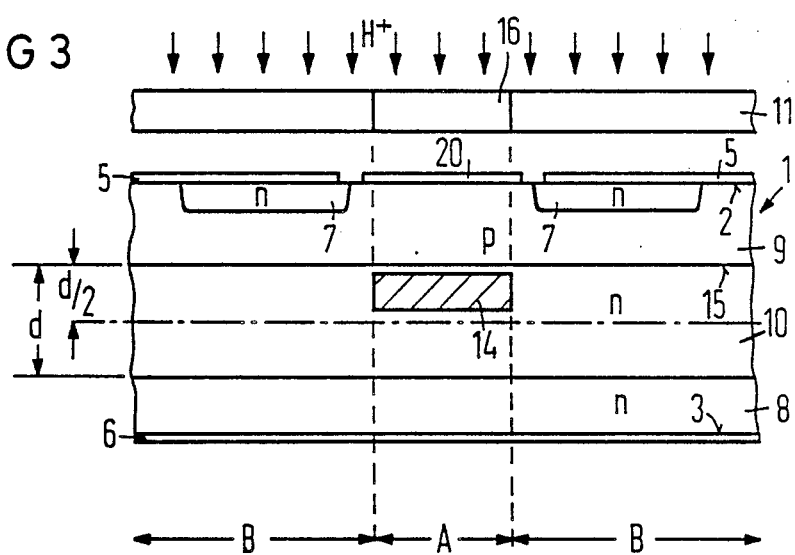

PROCESS FOR MANUFACTURING A THYRISTOR WITH PROTON IRRADIATION

BACKGROUND OF THE INVENTION

The present invention relates to a process for manufacturing a thyristor in a semiconductor body, which contains an area which has a lower breakdown voltage than the rest of the semiconductor body, and it relates, more particularly, to a thyristor whose semiconductor body has at least a first major surface containing a control electrode, a second major surface and a first base region with an adjacent second base region.

These types of processes are known, for example, from German Patent document No. DE-OS 23 00 754 and serve to permit a controllable breakover firing of the thyristor in this area at the predetermined lower breakdown voltage. In that document, the area which has a lower breakdown voltage than the rest of the semiconductor body of the thyristor is manufactured, for example, by making the second base region thinner in this area than it is outside this area.

In German patent document No. DE-OS 23 46 205, a method is disclosed for forming the area with the lower breakthrough voltage in the semiconductor body by specially selecting as starting materials for the semiconductor body semiconductor disks which have a clearly defined area with a lower specific resistance. Semiconductor disks of this kind can be manufactured, for example, by a special silicon drawing process.

Another possibility for forming an area at the edge of the semiconductor body which has a lower breakdown voltage than the rest of the semiconductor body might consist in making the edge profile of the semiconductor body with a negative angle.

These familiar processes have the disadvantage that they often provide an unsatisfactory yield.

SUMMARY OF THE INVENTION

An object of the present invention is to provide a process that makes it possible to generate, in a subsequent manufacturing step, an area on an already existing thyristor pellet that has a lower breakdown voltage than the rest of the semiconductor body of the thyristor pellet.

A feature of the invention is to irradiate one major surface of the semiconductor body in this area with protons from a source of proton radiation while the proton energy is being measured to produce the maximum of the defect density and doping generated by the proton radiation lying between a PN junction of a first base region and the second base region and the half thickness of the second base region, and the semiconductor body is then subjected to heat treatment after the proton radiation.

In some of the further aspects of the invention, specific parameters for the heat treatment and irradiation process are set out. A screening device is placed to define and control the area of irradiation.

A particular advantage of the process according to the present invention is that an area with a lower breakdown voltage than the rest of the semiconductor body is formed in a subsequent manufacturing step on semiconductor bodies of the thyristor that are already provided with electrodes—in other words, on a thyristor pellet that has already been completed. For local proton irradiation a curing temperature ranging only from 250° to 350° C. is required. At this low temperature, the semiconductor body is treated for at least two hours. This low curing temperature effectively ensures that the electrodes already introduced in the semiconductor body do not melt and that any passivation layer that has already been applied to the semiconductor body is not damaged.

BRIEF DESCRIPTION OF THE DRAWING

Features of the invention and additional objects of the invention will be more readily appreciated and better understood by reference to the following detailed description which should be considered in conjunction with the drawing.

FIG. 3 illustrates a second semiconductor body of a thyristor with an area, generated by proton irradiation, that has a lower breakdown voltage.

DETAILED DESCRIPTION

Figure 1:
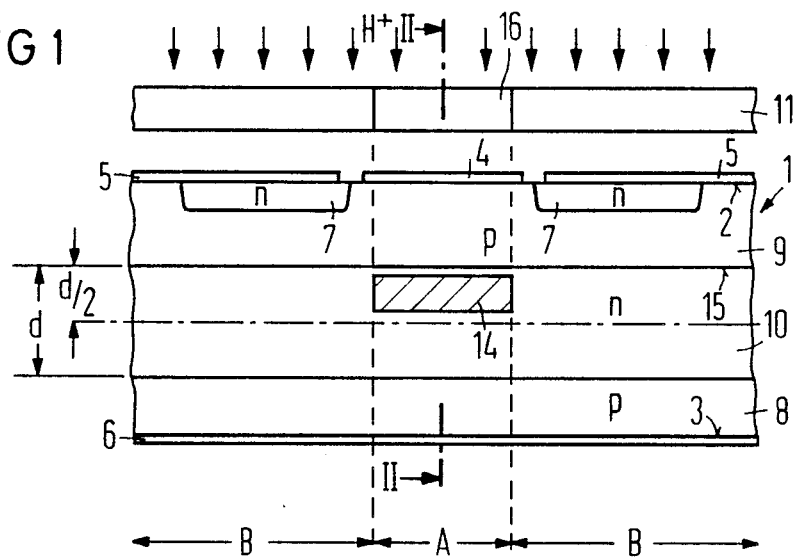
FIG. 1 illustrates the first semiconductor body of a thyristor wherein an area, generated by proton irradiation has a lower breakdown voltage.

In FIG. 1, a semiconductor body 1 of a thyristor, has between its first major surface 2 and its second major surface 3, at least to some extent, four regions, each with an alternating type of conductivity. The four regions each having an alternating type of conductivity are a first emitter region 7, a first base region 9 which is adjacent to this emitter zone, a second base region 10 with a thickness d which forms a PN junction 15 with the first base region 9, and a second emitter region 8 adjacent to the second base region 10. The first emitter region 7, which in this embodiment is imbedded in the first base region 9 in a planar manner, is connected to the first major surface 2 with a first emitter electrode 5. The first base region 9 is in contact with a control electrode 4, which is likewise located on the major surface 2. A second emitter electrode 6 is connected with the second emitter region 8. In the illustrative embodiment of FIG. 1, the first emitter zone 7 and the second base region 10 are n-doped, while the first base region 9 and the second emitter region 8 are p-doped.

The process according to the invention is intended to form an area in this semiconductor body 1 which has a lower breakdown voltage than the rest of the semiconductor body 1. In the illustrative embodiment of FIG. 1, this area with a lower breakdown voltage is to be formed in the portion of the semiconductor body 1 that is designated by A. The remaining portions of the semiconductor body are designated by B. In the illustrative embodiment of FIG. 1, the control electrode 4 is located within this area A of the semiconductor body. For local proton irradiation of the semiconductor body 1, a screening device 11 is located between proton radiation source (not shown in FIG. 1) and the major surface 2. The screening device 11 has an opening or aperture 16, through which the proton radiation H+ is exposed only to the target area A of the first major surface 2 of the semiconductor body. The diameter of the opening 16 in this example is selected to be somewhat smaller than the diameter of the control electrode 4, so that the first emitter region 7 is not irradiated with protons. The proton energy is measured in such a manner that the maximum of the impurity density and doping generated by the proton irradiation lies between the PN junction 15 of the first base region 9 and the second base region 10 and the half thickness d/2 of the second base region 10. The proton dosage is measured in such a way that, as required, a lower breakdown voltage is produced in the area A than in the remaining part B of the semiconductor body. After the proton irradiation, the semiconductor body 1 is heat treated. Preferably, this will be done for at least two hours at a temperature between 250° and 350° C.

It is desirable for the proton dosage on the major surface 2 to remain between $10^{11}$ and $10^{13}$ protons/cm$^2$, depending on the breakdown voltage that is to be produced. The proton energy will be between 2 and 6 MeV.

If the protons are to penetrate, for example, 200/µ into the semiconductor body, an accelerating energy of about 5 MeV is required. The way in which the accelerating energy of the protons depends upon the depth to be penetrated is known in the art, for example, see U.S. Pat. No. 4,056,408.

The proper selection of the proton energy of the proton radiation also ensures that the protons penetrate the PN junction 15 and come to rest a short distance behind it. In this "braking" zone 14, the greatest defect density and doping is generated. Its depth is about 10% of the average depth of penetration.

Figure 2:
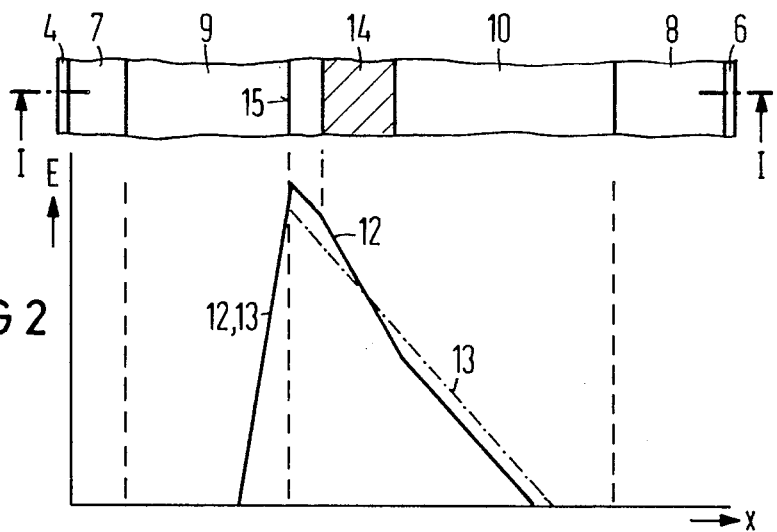
FIG. 2 graphically demonstrates the field strength distribution E (x) in the area of the semiconductor body along the axis II—II in FIG. 1.

FIG. 2 shows the field strength distribution in the region of the semiconductor body 1 shown in FIG. 1 along the axis II—II that has been drawn on it. The doping produced by the proton irradiation leads to a field strength distribution E (x) in the space charge region, which is shown by the curve 12 that has been drawn through it. The dotted-dashed curve 13 shown in FIG. 2 shows the field strength distribution E (x) in the semiconductor body 1 that has not been treated with proton irradiation. In the braking zone 14, the field strength gradient, according to the Poisson ratio, is larger than in the remaining part of the second base region 10. Accordingly, the breakdown field strength in zone A is reached sooner than in portion B. It is true that as a result of the proton irradiation in accordance with the invention, the space charge region in the second base region 10 expands somewhat less and that, further to the resulting greater distance to the second emitter region 8, the partial transistor amplification of the thyristor is somewhat reduced and the transistor blocking voltage is raised. However, this is balanced and overcompensated by an increased level of charge carrier generation in the braking region 14.

FIG. 3 shows a second semiconductor body of a thyristor. When used in FIG. 3, the same reference symbols represent the same parts as in FIG. 1. The difference from the semiconductor body of FIG. 1 is that now an auxiliary control electrode 20 is located in the area with a lower breakdown voltage. The control electrode is not shown.

There has thus been shown and described a novel process for making semiconductor devices which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. A process for making a thyristor comprising (a) a semiconductor body having a first major surface and a second major surface, (b) at least one control electrode on the first major surface, (c) a first base region in the semiconductor body connected with the control electrode, and (d) a second base region having a thickness "d" in the semiconductor body adjacent the first base region, the process comprising the steps of:
   (1) irradiating one of the major surfaces of the semiconductor body with protons having a controlled energy, the energy of the protons being controlled such that a maximum defect density and doping produced by the proton irradiation lies in the second base region within a distance d/2 from a PN junction formed by the first and second base regions; and
   (2) heat treating the semiconductor body after the proton irradiation.

2. The process of claim 1, in which the irradiating step comprises irradiating an area of one of the major surfaces of the semiconductor body on which a control electrode is formed.

3. The process of claim 1, in which the irradiating step comprises irradiating an area on one of the major surfaces of the semiconductor body on which an auxiliary control electrode is formed.

4. The process of claim 1, in which the irradiating step comprises the step of irradiating one of the major surfaces of the semiconductor body through a screening device so that only a portion of the irradiated major surface is exposed to proton irradiation.

5. The process of claim 4, in which the irradiating step comprises the step of irradiating one of the major surfaces of the semiconductor body with a proton dosage of $10^{11}$ to $10^{13}$ protons/centimeter$^2$.

6. The process of claim 4, in which the irradiating step comprises the step of irradiating one of the major surfaces of the semiconductor body with protons having an energy of 2 to 6 MeV.

7. The process of claim 4, in which the irradiating step comprises irradiating an area of one of the major surfaces of the semiconductor body on which a control electrode is formed.

8. The process of claim 1, in which the irradiating step comprises the step of irradiating one of the major surfaces of the semiconductor body with a proton dosage of $10^{11}$ to $10^{13}$ protons/centimeter$^2$.

9. The process of claim 8, in which the irradiating step comprises the step of irradiating one of the major surfaces of the semiconductor body with protons having an energy of 2 to 6 MeV.

10. The process of claim 1, in which the irradiating step comprises the step of irradiating one of the major surfaces of the semiconductor body with protons having an energy of 2 to 6 MeV.

11. The process of claim 10, in which the irradiating step comprises irradiating an area of one of the major surfaces of the semiconductor body on which a control electrode is formed.

12. The process of claim 1, in which the heat treating step comprises heating the semiconductor body to a temperature of 250° to 350° C. for at least two hours.

13. The process of claim 12, in which the irradiating step comprises the step of irradiating one of the major surfaces of the semiconductor body with a proton dosage of $10^{11}$ to $10^{13}$ protons/centimeter$^2$.

14. The process of claim 12, in which the irradiating step comprises the step of irradiating one of the major surfaces of the semiconductor body with protons having an energy of 2 to 6 MeV.

15. The process of claim 12, in which the irradiating step comprises irradiating an area of one of the major surfaces of the semiconductor body on which a control electrode is formed.

16. The process of claim 12, in which the irradiating step comprises the step of irradiating one of the major surfaces of the semiconductor body through a screening device so that only a portion of the irradiated major surface is exposed to proton irradiation.

17. The process of claim 16, in which the irradiating step comprises irradiating an area of one of the major surfaces of the semiconductor body on which a control electrode is formed.

18. A process for making a thyristor with controllable breakover firing comprising (a) a semiconductor body having a first major surface and a second major surface, (b) at least one control electrode on the first major surface, (c) a first base region in the semiconductor body connected with the control electrode, and (d) a second base region having a thickness "d" in the semiconductor body adjacent the first base region, the process comprising the steps of:

(1) irradiating one of the major surfaces of the semiconductor body with protons having a controlled energy, the energy of the protons being controlled such that an increase in field strength gradient produced by the proton irradiation is located in the second base region within a distance d/2 from a PN junction formed by the first and second base regions; and (2) heat treating the semiconductor body after the proton irradiation.

* * * * *